(12) United States Patent
Lin et al.

(10) Patent No.: US 10,694,595 B2
(45) Date of Patent: Jun. 23, 2020

(54) LIGHT EMITTING DIODE DRIVING CIRCUIT WITH LOW HARMONIC DISTORTION

(71) Applicant: EDISON OPTO (DONGGUAN) CO., LTD., Dongguan, Guang Dong (CN)

(72) Inventors: Yu-Chen Lin, Dongguan (CN); Hung-Chan Wang, Dongguan (CN); Jin-Ping Liu, Dongguan (CN)

(73) Assignee: EDISON OPTO (DONGGUAN) CO., LTD., Dongguan, Guang Dong (CN)

( * ) Notice: Subject to any disclaimer, the term of this patent is extended or adjusted under 35 U.S.C. 154(b) by 583 days.

(21) Appl. No.: 15/650,979

(22) Filed: Jul. 17, 2017

(65) Prior Publication Data

US 2018/0324909 A1 Nov. 8, 2018

(30) Foreign Application Priority Data

May 5, 2017 (CN) .......................... 2017 1 0313393

(51) Int. Cl.
| | | |
|---|---|---|
| *H05B 45/00* | (2020.01) | |
| *H05B 45/395* | (2020.01) | |
| *G02F 1/35* | (2006.01) | |
| *H05B 33/06* | (2006.01) | |
| *H01L 33/00* | (2010.01) | |

(52) U.S. Cl.
CPC ............. *H05B 45/00* (2020.01); *G02F 1/353* (2013.01); *H05B 33/06* (2013.01); *H05B 45/395* (2020.01); *H01L 33/0045* (2013.01)

(58) Field of Classification Search
USPC ........................................ 315/192, 201, 287
See application file for complete search history.

(56) References Cited

U.S. PATENT DOCUMENTS

| | | | |
|---|---|---|---|
| 9,769,901 B1 * | 9/2017 | Vaughan | ............... H05B 45/37 |
| 2015/0091466 A1 | 4/2015 | Levy | |
| 2015/0216006 A1 | 7/2015 | Lee | |
| 2016/0073462 A1 | 3/2016 | Lan | |
| 2018/0310376 A1 * | 10/2018 | Huang | ................... H05B 45/44 |

FOREIGN PATENT DOCUMENTS

| | | |
|---|---|---|
| CN | 2884777 Y | 3/2007 |
| CN | 105792441 A | 7/2016 |
| CN | 205793519 U | 12/2016 |
| GB | 2516696 A | 2/2015 |
| KR | 10-1718959 B1 | 3/2017 |

* cited by examiner

*Primary Examiner* — Danny Nguyen
(74) *Attorney, Agent, or Firm* — Winston Hsu

(57) ABSTRACT

The present invention provides a light emitting diode (LED) driving circuit with low harmonic distortion. The LED driving circuit comprises: a rectifying circuit, a linear constant current circuit, a current limiting circuit, and a current limiting ramp slope determining circuit. The rectifying circuit is utilized for rectifying an alternating current (AC) power source to provide a direct current (DC) voltage output. The linear constant current circuit is utilized for driving at least an LED. The current limiting circuit is connected in parallel between the rectifying circuit and the linear constant current circuit, and utilized for generating a current limiting effect and determining a current limiting height. The current limiting ramp slope determining circuit is connected in parallel between the rectifying circuit and the linear constant current circuit and connected in series with the current limiting circuit, and utilized for determining a current limiting ramp slope.

10 Claims, 8 Drawing Sheets

the multi-order linear constant current circuit of more than fifth-order to reduce the harmonic distortion, and thus the present invention can reduce the cost and circuit area.

LIGHT EMITTING DIODE DRIVING CIRCUIT WITH LOW HARMONIC DISTORTION

BACKGROUND OF THE INVENTION

1. Field of the Invention

The present invention relates to a light emitting diode driving circuit, and more particularly, to a low harmonic distortion light emitting diode driving circuit with low harmonic distortion.

2. Description of the Prior Art

In recent years, due to the rapid growth of environmental awareness, countries have to promote energy conservation and carbon reduction and other environmental policies. Reducing the power consumption of lighting fixtures is one example. At present, the most popular energy-saving lamp is the light emitting diode (LED) lighting lamp because of its energy saving, environmental protection, long lifetime and durable function, and it is gradually replacing the traditional lamps, and gradually extending to various applications.

Please refer to FIG. 1. FIG. 1 shows a simplified block diagram of a conventional LED driving circuit 100. As shown in FIG. 1, the LED driving circuit 100 includes a rectifying circuit 110 and a linear constant current circuit 120, wherein when the linear constant current circuit 120 is not a multi-order (over fifth-order) linear constant current circuit, the LED drive circuit 100 will have the problem of harmonic distortion. Thus, the conventional LED driving circuit requires the use of a multi-order (over fifth-order) linear constant current circuit to solve the problem of harmonic distortion. However, the multi-order (over fifth-order) linear constant current circuit cost and circuit area is much higher than the general low-order linear constant current circuit (such as the first-order synchronous linear constant current circuit, the second-order synchronous linear constant current circuit, or the third-order non-synchronous linear constant current circuit).

SUMMARY OF THE INVENTION

It is therefore one of the objectives of the present invention to provide a light emitting diode (LED) driving circuit with low harmonic distortion to make the whole harmonic close to the continuous sine wave output by the rectifier, to solve the above problem.

According to an embodiment of the present invention, an LED driving circuit with low harmonic distortion is disclosed. The LED driving circuit comprises: a rectifying circuit, a linear constant current circuit, a current limiting circuit, and a current limiting ramp slope determining circuit. The rectifying circuit is utilized for rectifying an alternating current (AC) power source to provide a direct current (DC) voltage output. The linear constant current circuit is utilized for driving at least an LED. The current limiting circuit is connected in parallel between the rectifying circuit and the linear constant current circuit, and utilized for generating a current limiting effect and determining a current limiting height. The current limiting ramp slope determining circuit is connected in parallel between the rectifying circuit and the linear constant current circuit and connected in series with the current limiting circuit, and utilized for determining a current limiting ramp slope.

Briefly summarized, the LED driving circuit with low harmonic distortion disclosed by the present invention can make the whole harmonics become closer to the continuous sine wave output by the rectifier, so it is not necessary to use the multi-order linear constant current circuit of more than fifth-order to reduce the harmonic distortion, and thus the present invention can reduce the cost and circuit area.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
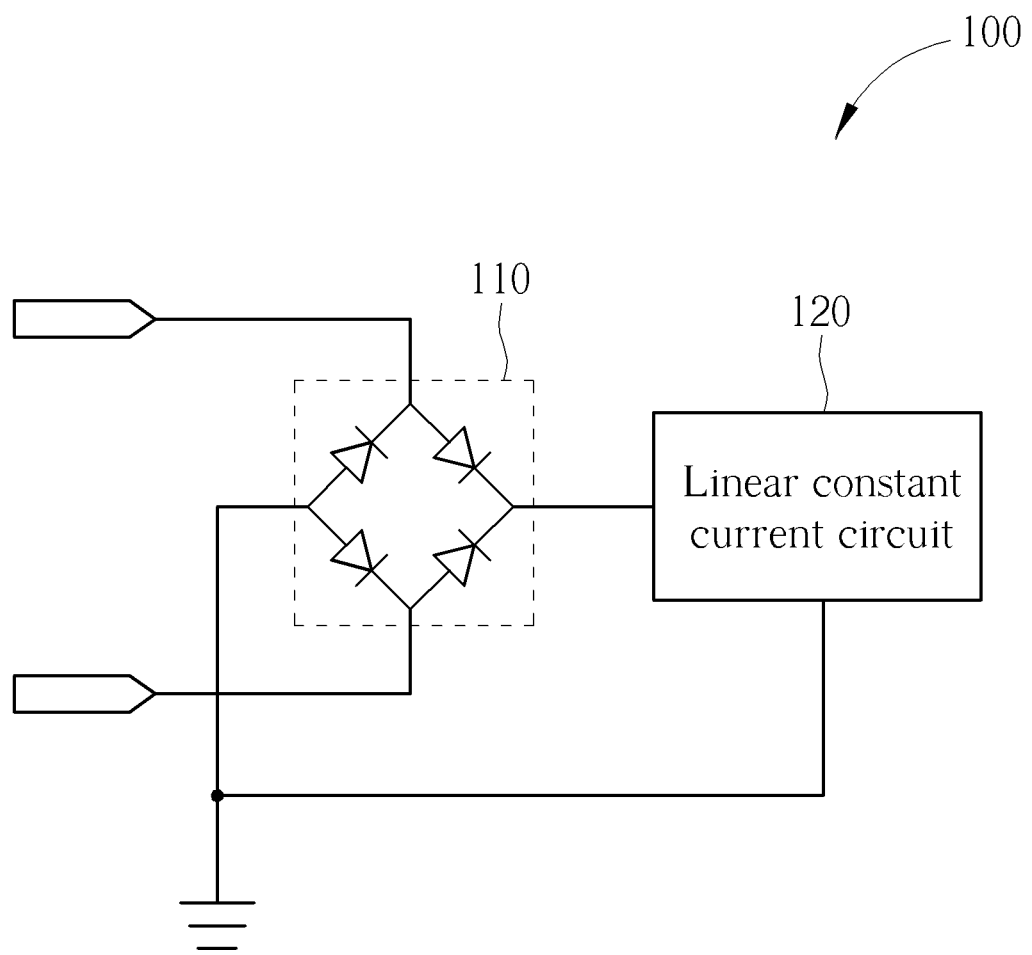
FIG. 1 shows a simplified block diagram of a conventional LED driving circuit.
Figure 2:
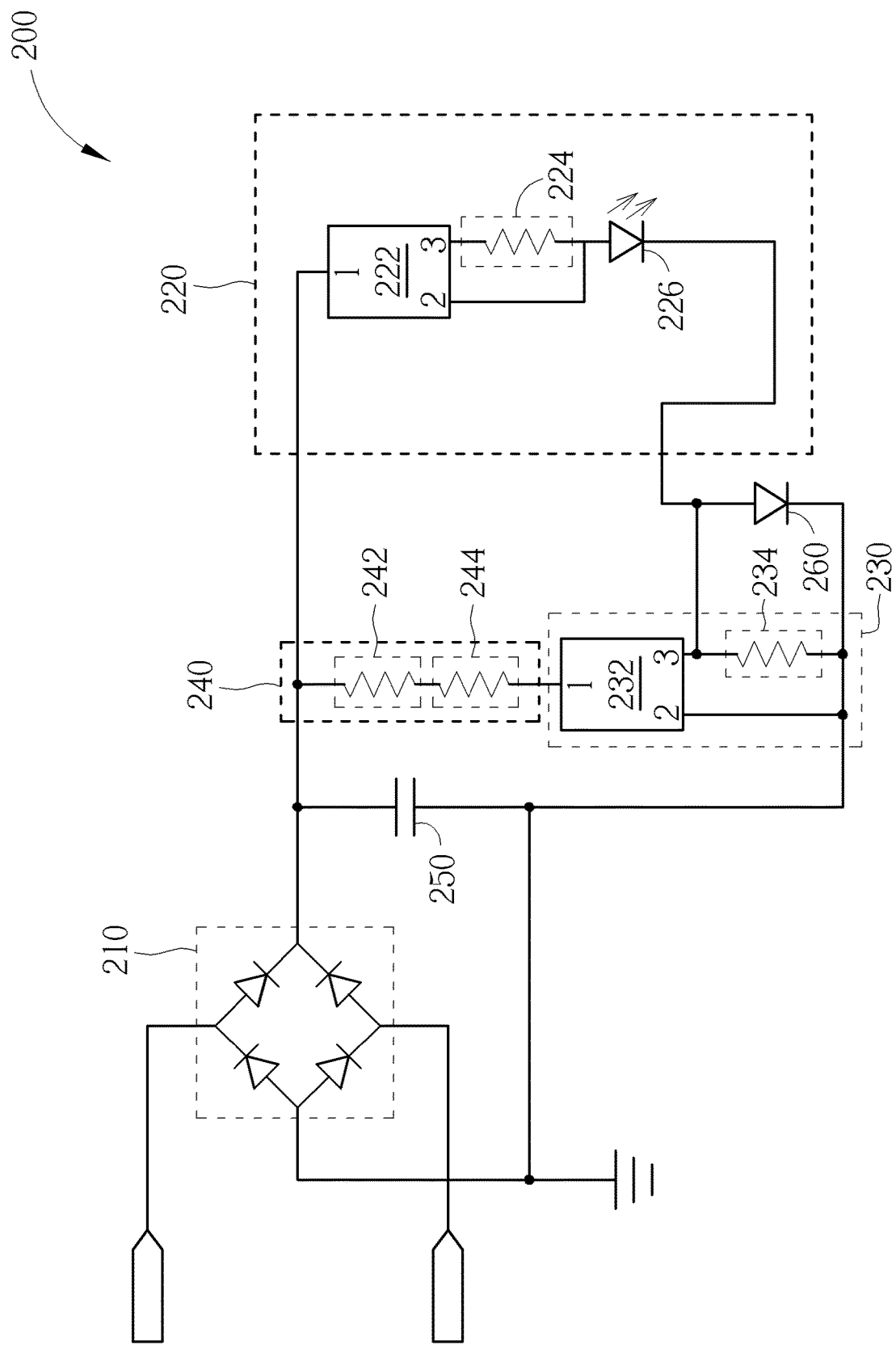
FIG. 2 shows a simplified block diagram of an LED driving circuit with low harmonic distortion in accordance with a first embodiment of the present invention.

Please refer to FIG. 2. FIG. 2 shows a simplified block diagram of a light emitting diode (LED) driving circuit 200 with low harmonic distortion in accordance with a first embodiment of the present invention. As shown in FIG. 2, the LED driving circuit 200 comprises: a rectifying circuit 210, a linear constant current circuit 220, a current limiting circuit 230, a current limiting ramp slope determining circuit 240, a capacitor 250, and a diode 260, wherein the linear constant current circuit 220 is a first-order synchronous linear constant current circuit and utilized for driving at least an LED. The rectifying circuit 210 is utilized for rectifying an alternating current (AC) power source to provide a direct current (DC) voltage output. The capacitor 250 is utilized for solving the problem of electromagnetic interference (EMI), and the diode 260 is utilized for the regulation and discharge paths, in which the diode 260 has little effect on the low harmonic distortion function of the present invention, and therefore the diode 260 may be optionally omitted in other embodiments. The linear constant current circuit 220 comprises: a first LED 226, a resistor 224, and a constant current circuit 222. The first LED 226 is coupled to the current limiting circuit 230, and the resistor 224 is coupled to the first LED 226. The constant current circuit 222 has a voltage input and constant current output terminal 1, a ground terminal 2, and an output current value setting terminal 3, wherein the voltage input and constant current output terminal 1 is coupled to the current limiting ramp slope determining circuit 240, and the output current value setting terminal 3 is coupled to the resistor 224. Since the operation principle of the linear constant current circuit 220 is similar to that of the conventional linear constant current circuit, detail description of the operation principle is omitted, and the current limiting circuit 230 and the current limiting ramp slope determination circuit 240 of the present invention can be applied to various kinds of linear constant current circuits with the same effect. The current limiting circuit 230 is connected in parallel between the rectifying circuit 210 and the linear constant current circuit 220, and utilized for generating a current limiting effect and determining a current limiting height. The current limiting circuit 230 comprises: a constant current circuit 232 and a resistor 234.

Figure 3:
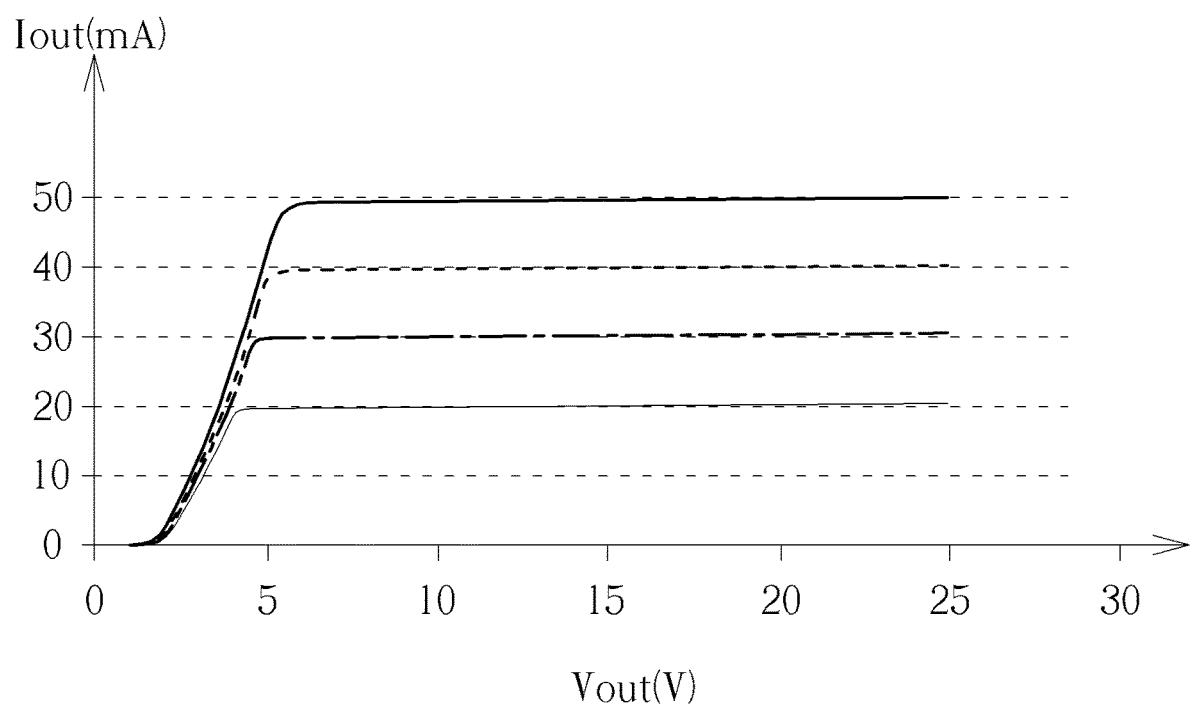
FIG. 3 is a constant current curve diagram of the constant current device in FIG. 2.
Figure 4:
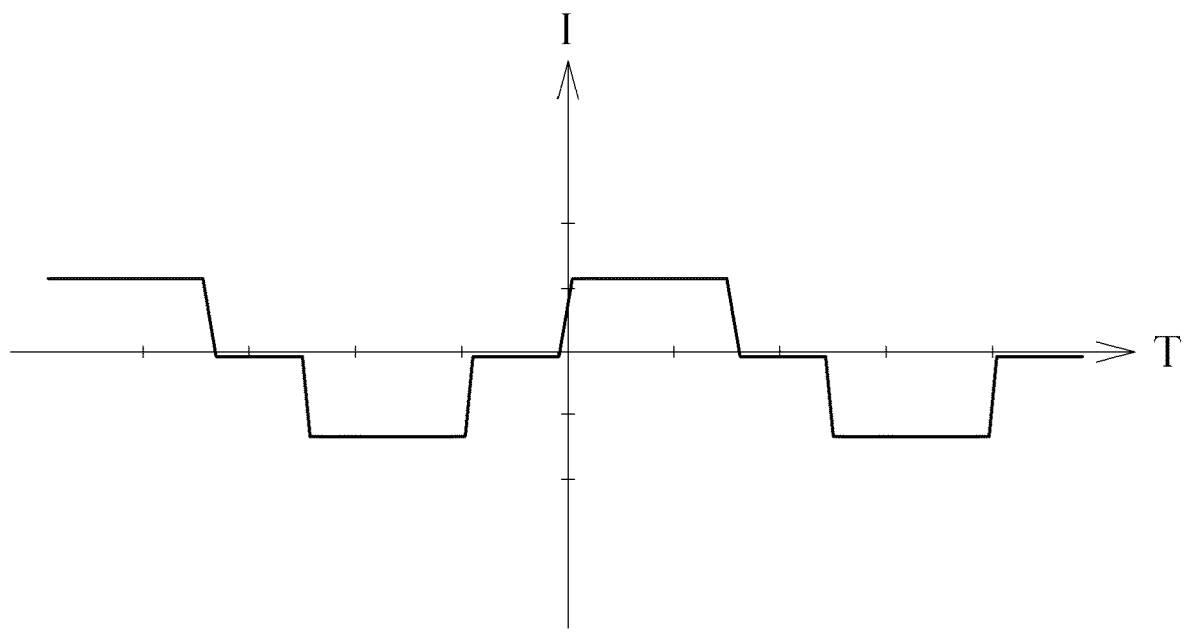
FIG. 4 is a diagram of harmonic of a conventional LED driving circuit.
Figure 5:
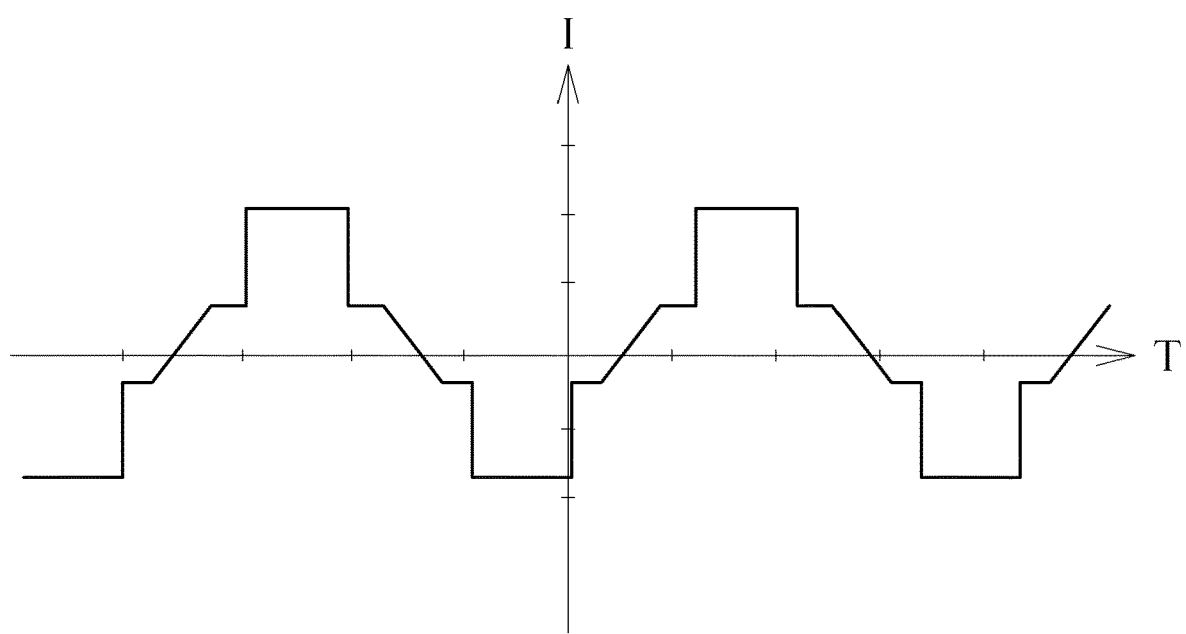
FIG. 5 is a diagram of harmonic of the LED driving circuit with low harmonic distortion of the present invention.

The constant current circuit 232 has a voltage input and constant current output terminal 1, a ground terminal 2, and an output current value setting terminal 3, and utilized for generating the current limiting effect, wherein the voltage input and constant current output terminal 1 is coupled to the current limiting ramp slope determining circuit 240. Please refer to FIG. 3. FIG. 3 is a constant current curve diagram of the constant current device 232, wherein the current Iout in FIG. 3 is an output current value of the voltage input and the constant current output terminal 1 and the voltage Vout is an input voltage value of the voltage input and the constant current output terminal 1. In other words, the height of the current Iout is the current limiting height. The resistor 234 is coupled to the output current value setting terminal 3 and utilized for determining the current limiting height because there is a reference voltage inside the constant current circuit 232 and when the resistance value of the resistor 234 is changed, the output current value of the constant current circuit 232 will change accordingly (As shown in FIG. 3, when the resistance value of the resistor 234 becomes larger, the output current value of the constant current circuit 232 becomes smaller). Thus, the resistor 234 can determine the current limiting height, wherein the resistor 234 can be a variable resistor. The current limiting ramp slope determining circuit 240 is connected in parallel between the rectifying circuit 210 and the linear constant current circuit 220 and connected in series with the current limiting circuit 230, and utilized for determining a current limiting ramp slope (i.e. the ramp slope of the current Iout in FIG. 3). The current limiting ramp slope determining circuit 240 comprises a first resistor 242 and a second resistor 244, and utilized for determining the current limiting ramp slope. This is because the current is a wave having a slope when the constant current device 232 does not reach a normal operating voltage (i.e. about 5 volts in FIG. 3), so that by changing the resistance value of the first resistor 242 and the second resistor 244 the present invention can change the normal operating voltage and simultaneously change the slope of the current ramp slope (for example, making the current ramp slope smaller by increasing the normal operating voltage), wherein the first resistor 242 or The second resistor 244 can be a variable resistor. Please refer to FIG. 4 and FIG. 5. FIG. 4 is a diagram of harmonic of a conventional LED driving circuit (i.e. without the current limiting circuit 230 and the current limiting ramp slope determining circuit 240 of the present invention), and FIG. 5 is a diagram of harmonic of the LED driving circuit 200 with low harmonic distortion of the present invention, wherein the harmonic in FIG. 5 is significantly closer to the sine wave than the harmonic in FIG. 4. In this way, the LED driving circuit 200 with low harmonic distortion disclosed by the present invention can make the whole harmonics become closer to the continuous sine wave output by the rectifier, that is, to reduce the harmonic distortion.

In addition, it is to be noted that the above-described embodiment is only for an illustrative purpose and is not meant to be a limitation of the present invention. For example, the number of resistors contained in the current limiting ramp slope decision circuit 240 may vary depending on different design requirements. The series resistance designed in the present embodiment has some advantages such as a slow rising time of the voltage and a small electromagnetic interference, etc. The LED driving circuit 200 with low harmonic distortion can also be applied to other different synchronous linear constant current circuits and non-synchronous linear constant current circuits.

Figure 6:
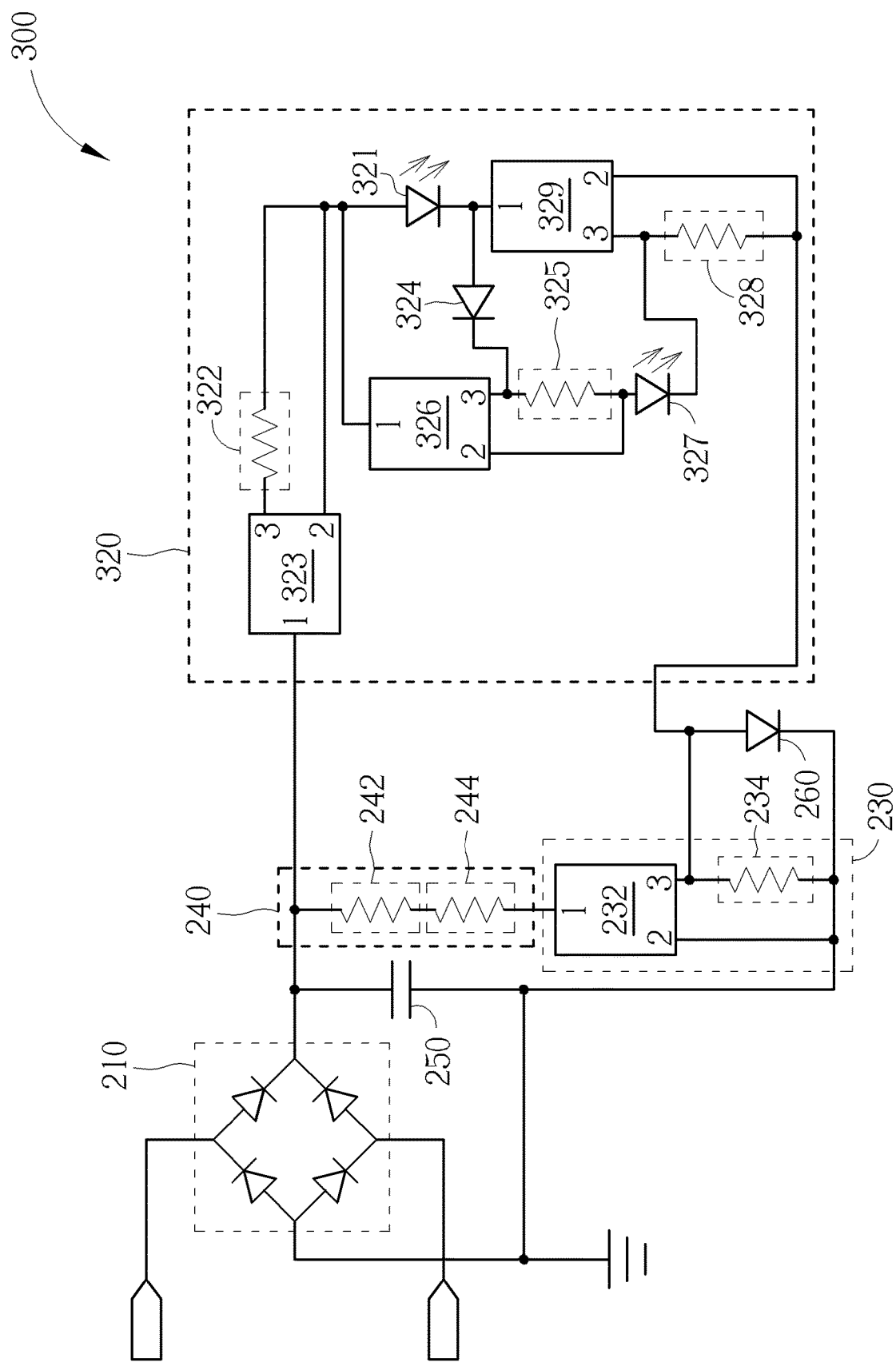
FIG. 6 shows a simplified block diagram of an LED driving circuit with low harmonic distortion in accordance with a second embodiment of the present invention.

Please refer to FIG. 6. FIG. 6 shows a simplified block diagram of an LED driving circuit 300 with low harmonic distortion in accordance with a second embodiment of the present invention. As shown in FIG. 6, the LED driving circuit 300 comprises: a rectifying circuit 210, a linear constant current circuit 320, a current limiting circuit 230, a current limiting ramp slope determining circuit 240, a capacitor 250, and a diode 260, wherein the linear constant current circuit 320 is a second-order synchronous linear constant current circuit and utilized for driving at least an LED. In addition, the setting of the rectifying circuit 210, the current limiting circuit 230, the current limiting ramp slope determining circuit 240, the capacitor 250, and the diode 260 is the same as that of the embodiment in FIG. 2, and thus the description is omitted for the sake of brevity. The linear constant current circuit 320 comprises: a first LED 321, a first resistor 322, a first constant current circuit 323, a diode 324, a second resistor 325, a second constant current circuit 326, a second LED 327, a third resistor 328, and a third constant current circuit 329. The first resistor 322 is coupled to the first LED 321. The first constant current circuit 323 has a voltage input and constant current output terminal 1, a ground terminal 2, and an output current value setting terminal 3, wherein the voltage input and constant current output terminal 1 of the first constant current circuit 323 is coupled to the current limiting ramp slope determining circuit 240, and the output current value setting terminal 3 of the first constant current circuit 323 is coupled to the first resistor. The diode 324 is coupled to the first LED 321. The second resistor 325 is coupled to the diode 324. The second constant current circuit 326 has a voltage input and constant current output terminal 1, a ground terminal 2, and an output current value setting terminal 3, wherein the voltage input and constant current output terminal 1 of the second constant current circuit 326 is coupled to the first resistor 322 and the first LED 321, and the output current value setting terminal 3 of the second constant current circuit 326 is coupled to the second resistor 325 and the diode 324. The second LED 327 is coupled to the second resistor 325. The third resistor 328 is coupled to the second LED 327. The third constant current circuit 329 has a voltage input and constant current output terminal 1, a ground terminal 2, and an output current value setting terminal 3, wherein the voltage input and constant current output terminal 1 of the third constant current circuit 329 is coupled to the diode and the first LED, and the output current value setting terminal 3 of the third constant current circuit 329 is coupled to the third resistor 328 and the second LED 327. Since the operation principle of the linear constant current circuit 320 is similar to that of the conventional linear constant current circuit, detail description of the operation principle is omitted, and the current limiting circuit 230 and the current limiting ramp slope determination circuit 240 of the present invention can be applied to various kinds of linear constant current circuits with the same effect. In this way, the LED driving circuit 300 with low harmonic distortion disclosed by the present invention can make the whole harmonics become closer to the continuous sine wave output by the rectifier, that is, to reduce the harmonic distortion.

Figure 7:
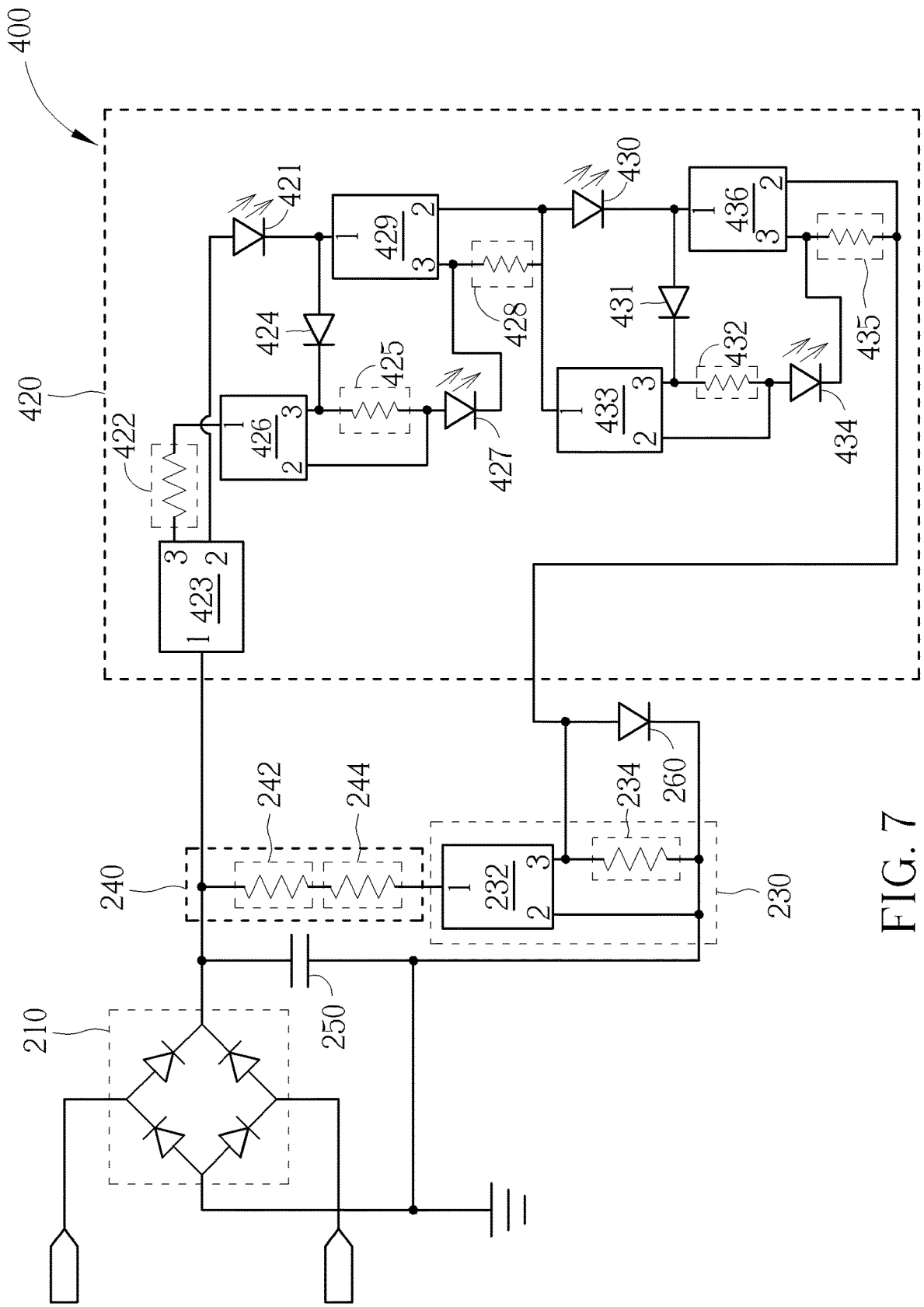
FIG. 7 shows a simplified block diagram of an LED driving circuit with low harmonic distortion in accordance with a third embodiment of the present invention.

Please refer to FIG. 7. FIG. 7 shows a simplified block diagram of an LED driving circuit 400 with low harmonic distortion in accordance with a third embodiment of the present invention. As shown in FIG. 7, the LED driving circuit 600 comprises: a rectifying circuit 210, a linear constant current circuit 420, a current limiting circuit 230, a current limiting ramp slope determining circuit 240, a capacitor 250, and a diode 260, wherein the linear constant current circuit 420 is a third-order synchronous linear constant current circuit and utilized for driving at least an LED. In addition, the setting of the rectifying circuit 210, the current limiting circuit 230, the current limiting ramp slope determining circuit 240, the capacitor 250, and the diode 260 is the same as that of the embodiment in FIG. 2, and thus the description is omitted for the sake of brevity. The linear constant current circuit 420 comprises: a first LED 421, a first resistor 422, a first constant current circuit 423, a first diode 424, a second resistor 425, a second constant current circuit 426, a second LED 427, a third resistor 428, a third constant current circuit 429, a third LED 430, a second diode 431, a fourth resistor 432, a fourth constant current circuit 433, a fourth LED 434, a fifth resistor 435, and a fifth constant current circuit 436. The first resistor 422 is coupled to the first LED 421. The first constant current circuit 423 has a voltage input and constant current output terminal 1, a ground terminal 2, and an output current value setting terminal 3, wherein the voltage input and constant current output terminal 1 of the first constant current circuit 423 is coupled to the current limiting ramp slope determining circuit 240, and the output current value setting terminal 3 of the first constant current circuit 423 is coupled to the first resistor 422. The first diode 424 is coupled to the first LED 421. The second resistor 425 is coupled to the first diode 424. The second constant current circuit 426 has a voltage input and constant current output terminal 1, a ground terminal 2, and an output current value setting terminal 3, wherein the voltage input and constant current output terminal 1 of the second constant current circuit 426 is coupled to the first resistor 422 and the first LED 421, and the output current value setting terminal 3 of the second constant current circuit 426 is coupled to the second resistor 425 and the first diode 424. The second LED 427 is coupled to the second resistor 425. The third resistor 428 is coupled to the second LED 427. The third constant current circuit 429 has a voltage input and constant current output terminal 1, a ground terminal 2, and an output current value setting terminal 3, wherein the voltage input and constant current output terminal 1 of the third constant current circuit 429 is coupled to the first diode and the first LED, and the output current value setting terminal 3 of the third constant current circuit 429 is coupled to the third resistor 428 and the second LED 427. The second diode 431 is coupled to the third LED 430. The fourth resistor 432 is coupled to the second diode 431. The fourth constant current circuit 433 has a voltage input and constant current output terminal 1, a ground terminal 2, and an output current value setting terminal 3, wherein the voltage input and constant current output terminal 1 of the fourth constant current circuit 433 is coupled to the third resistor 428 and the third LED 430, and the output current value setting terminal 3 of the fourth constant current circuit 433 is coupled to the fourth resistor 432 and the second diode 431. The fourth LED 434 is coupled to the fourth resistor 432. The fifth resistor 435 is coupled to the fourth LED 434. The fifth constant current circuit 436 has a voltage input and constant current output terminal 1, a ground terminal 2, and an output current value setting terminal 3, wherein the voltage input and constant current output terminal 1 of the fifth constant current circuit 436 is coupled to the second diode 431 and the third LED 430, and the output current value setting terminal 3 of the fifth constant current circuit 436 is coupled to the fifth resistor 435 and the fourth LED 434. Since the operation principle of the linear constant current circuit 420 is similar to that of the conventional linear constant current circuit, detail description of the operation principle is omitted, and the current limiting circuit 230 and the current limiting ramp slope determination circuit 240 of the present invention can be applied to various kinds of linear constant current circuits with the same effect. In this way, the LED driving circuit 400 with low harmonic distortion disclosed by the present invention can make the whole harmonics become closer to the continuous sine wave output by the rectifier, that is, to reduce the harmonic distortion.

Figure 8:
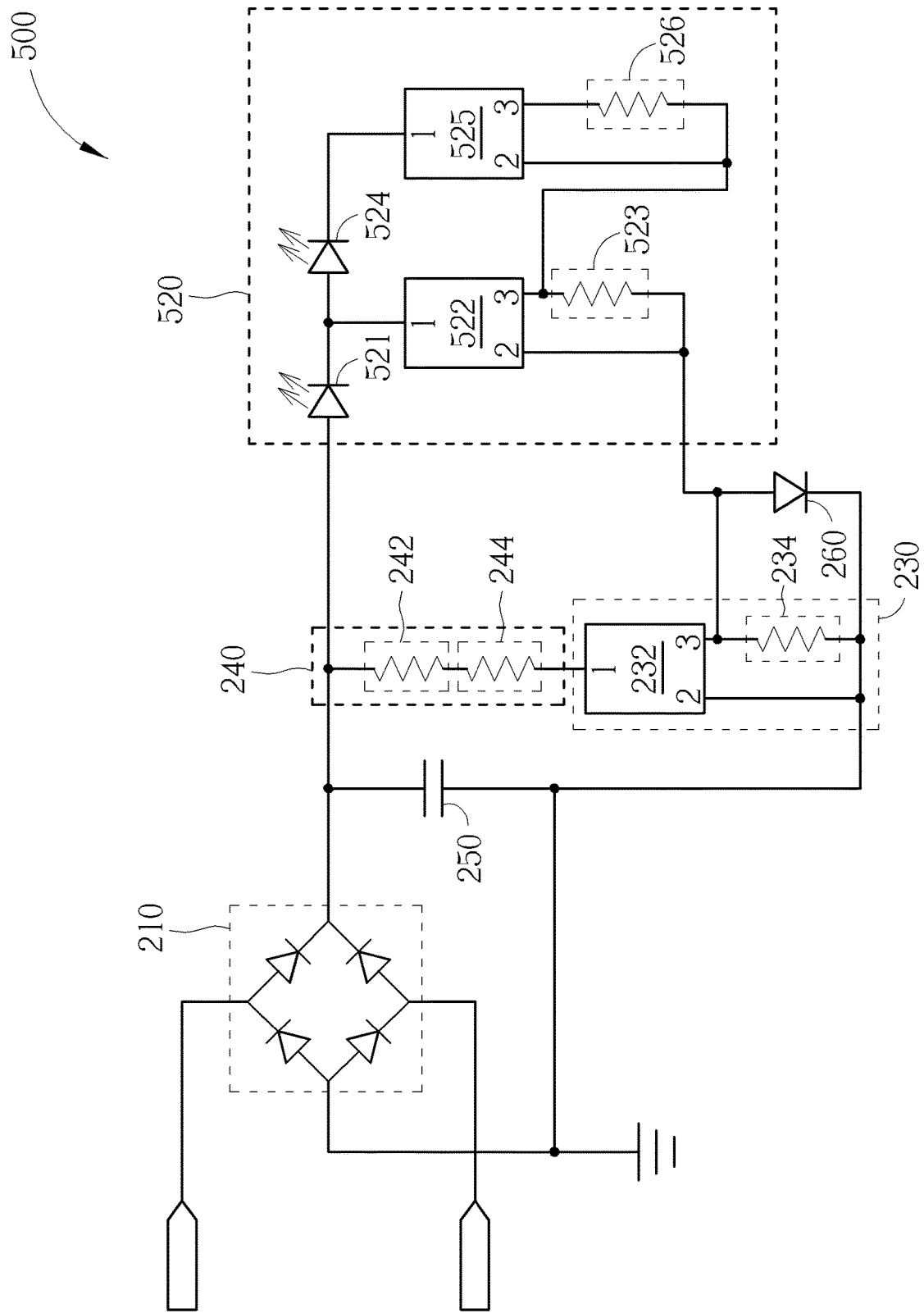
FIG. 8 shows a simplified block diagram of an LED driving circuit with low harmonic distortion in accordance with a fourth embodiment of the present invention.

Please refer to FIG. 8. FIG. 8 shows a simplified block diagram of an LED driving circuit 500 with low harmonic distortion in accordance with a fourth embodiment of the present invention. As shown in FIG. 8, the LED driving circuit 500 comprises: a rectifying circuit 210, a linear constant current circuit 520, a current limiting circuit 230, a current limiting ramp slope determining circuit 240, a capacitor 250, and a diode 260, wherein the linear constant current circuit 520 is a second-order non-synchronous linear constant current circuit and utilized for driving at least an LED. In addition, the setting of the rectifying circuit 210, the current limiting circuit 230, the current limiting ramp slope determining circuit 240, the capacitor 250, and the diode 260 is the same as that of the embodiment in FIG. 2, and thus the description is omitted for the sake of brevity. The linear constant current circuit 520 comprises: a first LED 521, a first constant current circuit 522, a first resistor 523, a second LED 524, a second constant current circuit 525, and a second resistor 526. The first LED 521 is coupled to the current limiting ramp slope determining circuit 240. The first constant current circuit 522 has a voltage input and constant current output terminal 1, a ground terminal 2, and an output current value setting terminal 3, wherein the voltage input and constant current output terminal 1 of the first constant current circuit 522 is coupled to first LED 521. The first resistor 523 is coupled to the output current value setting terminal 3 of the first constant current circuit 522. The second LED 524 is coupled to the first LED 521. The second constant current circuit 525 has a voltage input and constant current output terminal 1, a ground terminal 2, and an output current value setting terminal 3, wherein the voltage input and constant current output terminal 1 of the second constant current circuit 525 is coupled to the second LED 524. The second resistor 526 is coupled to the output current value setting terminal 3 of the second constant current circuit 525. Since the operation principle of the linear constant current circuit 520 is similar to that of the conventional linear constant current circuit, detail description of the operation principle is omitted, and the current limiting circuit 230 and the current limiting ramp slope determination circuit 240 of the present invention can be applied to various kinds of linear constant current circuits with the same effect. In this way, the LED driving circuit 500 with low harmonic distortion disclosed by the present invention can make the whole harmonics become closer to the continuous sine wave output by the rectifier, that is, to reduce the harmonic distortion.

Figure 9:
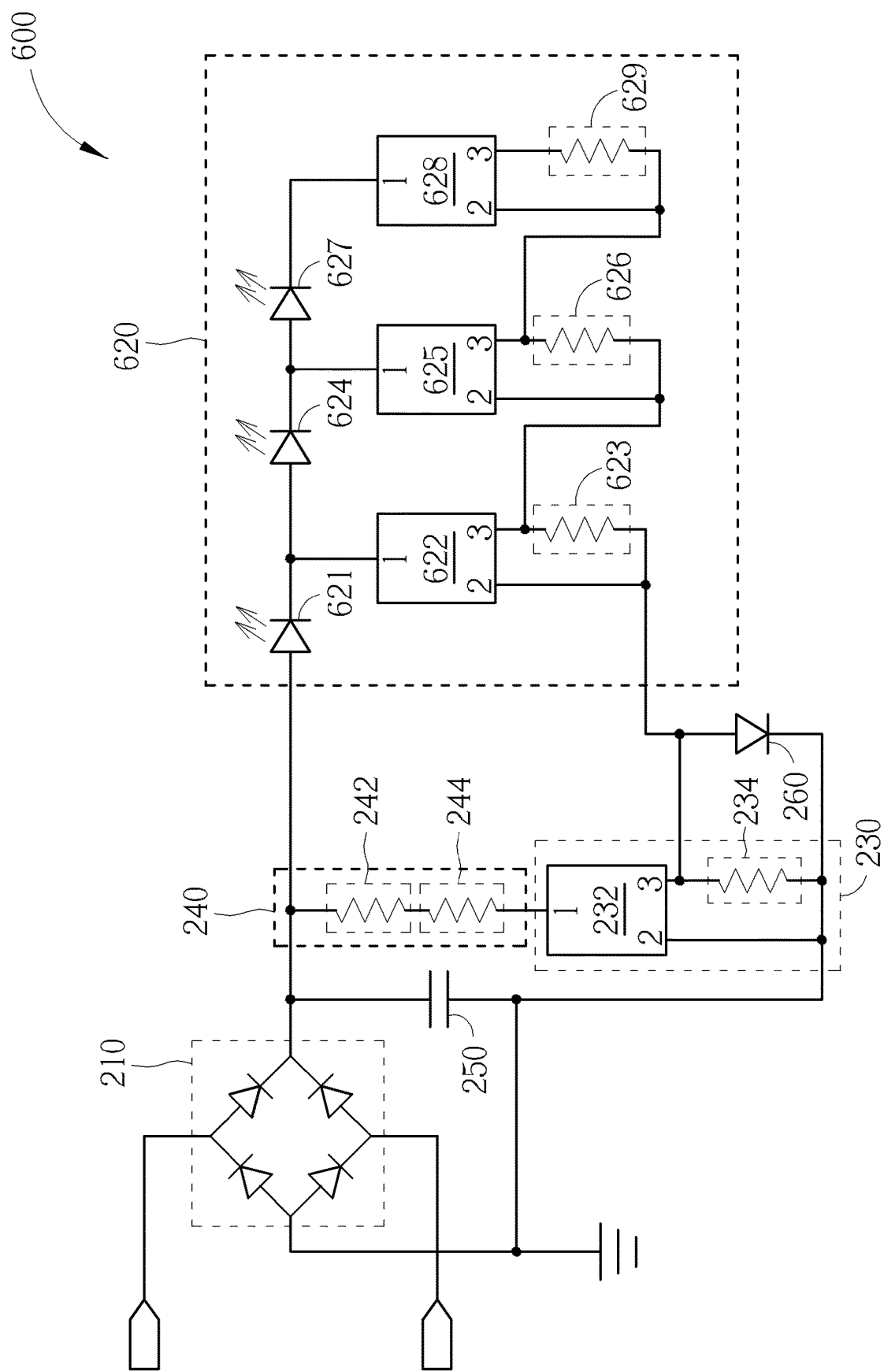
FIG. 9 shows a simplified block diagram of an LED driving circuit with low harmonic distortion in accordance with a fifth embodiment of the present invention.

Please refer to FIG. 9. FIG. 9 shows a simplified block diagram of an LED driving circuit 600 with low harmonic distortion in accordance with a fifth embodiment of the present invention. As shown in FIG. 9, the LED driving circuit 600 comprises: a rectifying circuit 210, a linear constant current circuit 620, a current limiting circuit 230, a current limiting ramp slope determining circuit 240, a capacitor 250, and a diode 260, wherein the linear constant current circuit 320 is a third-order non-synchronous linear constant current circuit and utilized for driving at least an LED. In addition, the setting of the rectifying circuit 210, the current limiting circuit 230, the current limiting ramp slope determining circuit 240, the capacitor 250, and the diode 260 is the same as that of the embodiment in FIG. 2, and thus the description is omitted for the sake of brevity. The linear constant current circuit 620 comprises: a first LED 621, a first constant current circuit 622, a first resistor 623, a second LED 624, a second constant current circuit 625, a second resistor 626, a third LED 627, a third constant current circuit 628, and a third resistor 629. The first LED 621 is coupled to the current limiting ramp slope determining circuit 240. The first constant current circuit 622 has a voltage input and constant current output terminal 1, a ground terminal 2, and an output current value setting terminal 3, wherein the voltage input and constant current output terminal 1 of the first constant current circuit 622 is coupled to first LED 621. The first resistor 623 is coupled to the output current value setting terminal 3 of the first constant current circuit 622. The second LED 624 is coupled to the first LED 621. The second constant current circuit 625 has a voltage input and constant current output terminal 1, a ground terminal 2, and an output current value setting terminal 3, wherein the voltage input and constant current output terminal 1 of the second constant current circuit 625 is coupled to the second LED 624. The second resistor 626 is coupled to the output current value setting terminal 3 of the second constant current circuit 625. The third LED 627 is coupled to the second LED 624. The third constant current circuit 628 has a voltage input and constant current output terminal 1, a ground terminal 2, and an output current value setting terminal 3, wherein the voltage input and constant current output terminal 1 of the third constant current circuit 628 is coupled to the third LED 627. The third resistor 629 is coupled to the output current value setting terminal 3 of the third constant current circuit 628. Since the operation principle of the linear constant current circuit 620 is similar to that of the conventional linear constant current circuit, detail description of the operation principle is omitted, and the current limiting circuit 230 and the current limiting ramp slope determination circuit 240 of the present invention can be applied to various kinds of linear constant current circuits with the same effect. In this way, the LED driving circuit 600 with low harmonic distortion disclosed by the present invention can make the whole harmonics become closer to the continuous sine wave output by the rectifier, that is, to reduce the harmonic distortion.

Briefly summarized, the LED driving circuit with low harmonic distortion disclosed by the present invention can make the whole harmonics become closer to the continuous sine wave output by the rectifier, so it is not necessary to use the multi-order linear constant current circuit of more than fifth-order to reduce the harmonic distortion, and thus the present invention can reduce the cost and circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting diode (LED) driving circuit with low harmonic distortion, comprising:
   a rectifying circuit, for rectifying an alternating current (AC) power source to provide a direct current (DC) voltage output;
   a linear constant current circuit, for driving at least an LED;
   a current limiting circuit, connected in parallel between the rectifying circuit and the linear constant current circuit, for generating a current limiting effect and determining a current limiting height; and
   a current limiting ramp slope determining circuit, connected in parallel between the rectifying circuit and the linear constant current circuit and connected in series with the current limiting circuit, for determining a current limiting ramp slope.

2. The LED driving circuit of claim 1, wherein the current limiting circuit comprises:
   a constant current circuit, having a voltage input and constant current output terminal, a ground terminal, and an output current value setting terminal, for generating the current limiting effect, wherein the voltage input and constant current output terminal is coupled to the current limiting ramp slope determining circuit; and
   a resistor, coupled to the output current value setting terminal, for determining the current limiting height of the constant current circuit.

3. The LED driving circuit of claim 1, wherein the current limiting ramp slope determining circuit comprises: at least a resistor, for determining the current limiting ramp slope.

4. The LED driving circuit of claim 1, wherein the linear constant current circuit is a synchronous linear constant current circuit.

5. The LED driving circuit of claim 4, wherein the linear constant current circuit is a first-order synchronous linear constant current circuit, and the first-order synchronous linear constant current circuit comprises:
   a first LED, coupled to the current limiting circuit;
   a resistor, coupled to the first LED; and
   a constant current circuit, having a voltage input and constant current output terminal, a ground terminal, and an output current value setting terminal, wherein the voltage input and constant current output terminal is coupled to the current limiting ramp slope determining circuit, and the output current value setting terminal is coupled to the resistor.

6. The LED driving circuit of claim 4, wherein the linear constant current circuit is a second-order synchronous linear constant current circuit, and the second-order synchronous linear constant current circuit comprises:
   a first LED;
   a first resistor, coupled to the first LED;
   a first constant current circuit, having a voltage input and constant current output terminal, a ground terminal, and an output current value setting terminal, wherein the voltage input and constant current output terminal of the first constant current circuit is coupled to the current limiting ramp slope determining circuit, and the output current value setting terminal of the first constant current circuit is coupled to the first resistor;

a diode, coupled to the first LED;
a second resistor, coupled to the diode;
a second constant current circuit, having a voltage input and constant current output terminal, a ground terminal, and an output current value setting terminal, wherein the voltage input and constant current output terminal of the second constant current circuit is coupled to the first resistor and the first LED, and the output current value setting terminal of the second constant current circuit is coupled to the second resistor and the diode;
a second LED, coupled to the second resistor;
a third resistor, coupled to the second LED; and
a third constant current circuit, having a voltage input and constant current output terminal, a ground terminal, and an output current value setting terminal, wherein the voltage input and constant current output terminal of the third constant current circuit is coupled to the diode and the first LED, and the output current value setting terminal of the third constant current circuit is coupled to the third resistor and the second LED.

7. The LED driving circuit of claim 4, wherein the linear constant current circuit is a third-order synchronous linear constant current circuit, and the third-order synchronous linear constant current circuit comprises:
a first LED;
a first resistor, coupled to the first LED;
a first constant current circuit, having a voltage input and constant current output terminal, a ground terminal, and an output current value setting terminal, wherein the voltage input and constant current output terminal of the first constant current circuit is coupled to the current limiting ramp slope determining circuit, and the output current value setting terminal of the first constant current circuit is coupled to the first resistor;
a first diode, coupled to the first LED;
a second resistor, coupled to the first diode;
a second constant current circuit, having a voltage input and constant current output terminal, a ground terminal, and an output current value setting terminal, wherein the voltage input and constant current output terminal of the second constant current circuit is coupled to the first resistor and the first LED, and the output current value setting terminal of the second constant current circuit is coupled to the second resistor and the first diode;
a second LED, coupled to the second resistor;
a third resistor, coupled to the second LED;
a third constant current circuit, having a voltage input and constant current output terminal, a ground terminal, and an output current value setting terminal, wherein the voltage input and constant current output terminal of the third constant current circuit is coupled to the first diode and the first LED, and the output current value setting terminal of the third constant current circuit is coupled to the third resistor and the second LED;
a third LED;
a second diode, coupled to the third LED;
a fourth resistor, coupled to the second diode;
a fourth constant current circuit, having a voltage input and constant current output terminal, a ground terminal, and an output current value setting terminal, wherein the voltage input and constant current output terminal of the fourth constant current circuit is coupled to the third resistor and the third LED, and the output current value setting terminal of the fourth constant current circuit is coupled to the fourth resistor and the second diode;
a fourth LED, coupled to the fourth resistor;
a fifth resistor, coupled to the fourth LED; and
a fifth constant current circuit, having a voltage input and constant current output terminal, a ground terminal, and an output current value setting terminal, wherein the voltage input and constant current output terminal of the fifth constant current circuit is coupled to the second diode and the third LED, and the output current value setting terminal of the fifth constant current circuit is coupled to the fifth resistor and the fourth LED.

8. The LED driving circuit of claim 1, wherein the linear constant current circuit is a non-synchronous linear constant current circuit.

9. The LED driving circuit of claim 8, wherein the linear constant current circuit is a second-order non-synchronous linear constant current circuit, and the second-order non-synchronous linear constant current circuit comprises:
a first LED, coupled to the current limiting ramp slope determining circuit;
a first constant current circuit, having a voltage input and constant current output terminal, a ground terminal, and an output current value setting terminal, wherein the voltage input and constant current output terminal of the first constant current circuit is coupled to first LED;
a first resistor, coupled to the output current value setting terminal of the first constant current circuit;
a second LED, coupled to the first LED;
a second constant current circuit, having a voltage input and constant current output terminal, a ground terminal, and an output current value setting terminal, wherein the voltage input and constant current output terminal of the second constant current circuit is coupled to the second LED; and
a second resistor, coupled to the output current value setting terminal of the second constant current circuit.

10. The LED driving circuit of claim 8, wherein the linear constant current circuit is a third-order non-synchronous linear constant current circuit, and the third-order non-synchronous linear constant current circuit comprises:
a first LED, coupled to the current limiting ramp slope determining circuit;
a first constant current circuit, having a voltage input and constant current output terminal, a ground terminal, and an output current value setting terminal, wherein the voltage input and constant current output terminal of the first constant current circuit is coupled to first LED;
a first resistor, coupled to the output current value setting terminal of the first constant current circuit;
a second LED, coupled to the first LED;
a second constant current circuit, having a voltage input and constant current output terminal, a ground terminal, and an output current value setting terminal, wherein the voltage input and constant current output terminal of the second constant current circuit is coupled to the second LED;
a second resistor, coupled to the output current value setting terminal of the second constant current circuit;
a third LED, coupled to the second LED;
a third constant current circuit, having a voltage input and constant current output terminal, a ground terminal, and an output current value setting terminal, wherein the voltage input and constant current output terminal of the third constant current circuit is coupled to the third LED; and a third resistor, coupled to the output current value setting terminal of the third constant current circuit.

\* \* \* \* \*